(12) United States Patent
Eidson

(10) Patent No.: US 6,741,952 B2
(45) Date of Patent: May 25, 2004

(54) INSTRUMENT TIMING USING SYNCHRONIZED CLOCKS

(75) Inventor: John C. Eidson, Palo Alto, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 150 days.

(21) Appl. No.: 10/077,550

(22) Filed: Feb. 15, 2002

(65) Prior Publication Data

US 2003/0158706 A1 Aug. 21, 2003

(51) Int. Cl.[7] .............................. G06F 15/00; G06F 1/04
(52) U.S. Cl. ........................................ 702/187; 713/502
(58) Field of Search ........................ 702/187; 710/260; 368/46; 370/503; 713/502

(56) References Cited

U.S. PATENT DOCUMENTS 5,471,631 A * 11/1995 Beardsley et al. .......... 713/502
5,566,180 A * 10/1996 Eidson et al. ............... 370/473
5,771,374 A * 6/1998 Burshtein et al. ........... 713/502
5,774,377 A * 6/1998 Eidson et al. ............... 702/187
6,539,341 B1 * 3/2003 Li et al. ...................... 702/187

* cited by examiner

Primary Examiner—John Barlow
Assistant Examiner—Toan M. Le

(57) ABSTRACT

An instrumentation system which provides relatively precise time correlation among obtained measurements without dependence on trigger signal timing. An instrumentation system according to the present teachings includes a set of instruments each having a clock and an event buffer for periodically logging a data record. Each data record includes a set of measurement data and a time-stamp obtained from the corresponding clock. The instrumentation system includes mechanisms for maintaining a synchronized time in the clocks and mechanisms for stopping the logging in the event buffers in response to an event of interest. Once event logging is stopped, the data records in the event buffers may be correlated using their time-stamps and a time-stamp associated with the event of interest.

20 Claims, 3 Drawing Sheets

INSTRUMENT TIMING USING SYNCHRONIZED CLOCKS

BACKGROUND OF THE INVENTION

1. Field of Invention

The present invention pertains to the field of instrumentation. More particularly, this invention relates to time coordination among instruments.

2. Art Background

An instrumentation system typically includes a set of instruments which are adapted to obtain measurements in an environment of interest. An example of an instrumentation system is a test system which usually includes a set of instruments that obtain measurements pertaining to a system or device under test. Examples of instruments include volt meters, oscilloscopes, signal generators, and logic analyzers to name a few examples.

Coordination among the measurements obtained by instruments in a typical prior instrumentation system is usually accomplished by applying trigger signals to the instruments whenever measurements are desired. For example, if it is desired that instrument A obtain a measurement at time t0 and that instrument B obtain a measurement at time t1 then a trigger signal is applied to instrument A at time t0 and a trigger signal is applied to instrument B at time t1.

It is often desirable in an instrumentation system to provide time correlation among the obtained measurements. Prior instrumentation systems typically correlate measurements in time by controlling the timing of the trigger signals applied to the instruments. Continuing with the above example, if it is desired to correlate measurements to time t0, then trigger signals may be applied to both instruments A and B at time t0 and the resulting measurements associated to time t0.

Unfortunately, the precision of time correlation in such a prior instrumentation system is usually hindered by a variety of factors. For example, the signal lines that carry trigger signals to different instruments usually create different propagation delays. In addition, the internal circuitry in different instruments usually have different latencies between a time a trigger signal is received and a time that a measurement is performed. Moreover, the engineering effort needed to compensate for such factors usually increases the overall cost of providing precise time coordination of measurements in prior instrumentation systems.

SUMMARY OF THE INVENTION

An instrumentation system is disclosed which provides relatively precise time correlation among obtained measurements without dependence on trigger signal timing. An instrumentation system according to the present teachings includes a set of instruments each having a clock and an event buffer for periodically logging a data record. Each data record includes a set of measurement data and a time-stamp obtained from the corresponding clock. The instrumentation system includes mechanisms for maintaining a synchronized time in the clocks and mechanisms for stopping the logging in the event buffers in response to an event of interest. Once event logging is stopped, the data records in the event buffers may be correlated using their time-stamps and a time-stamp associated with the event of interest. The precision of time correlation depends on the precision of clock synchronization rather than the precision of trigger signal timing as in prior systems.

Other features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which.

DETAILED DESCRIPTION

Figure 1:
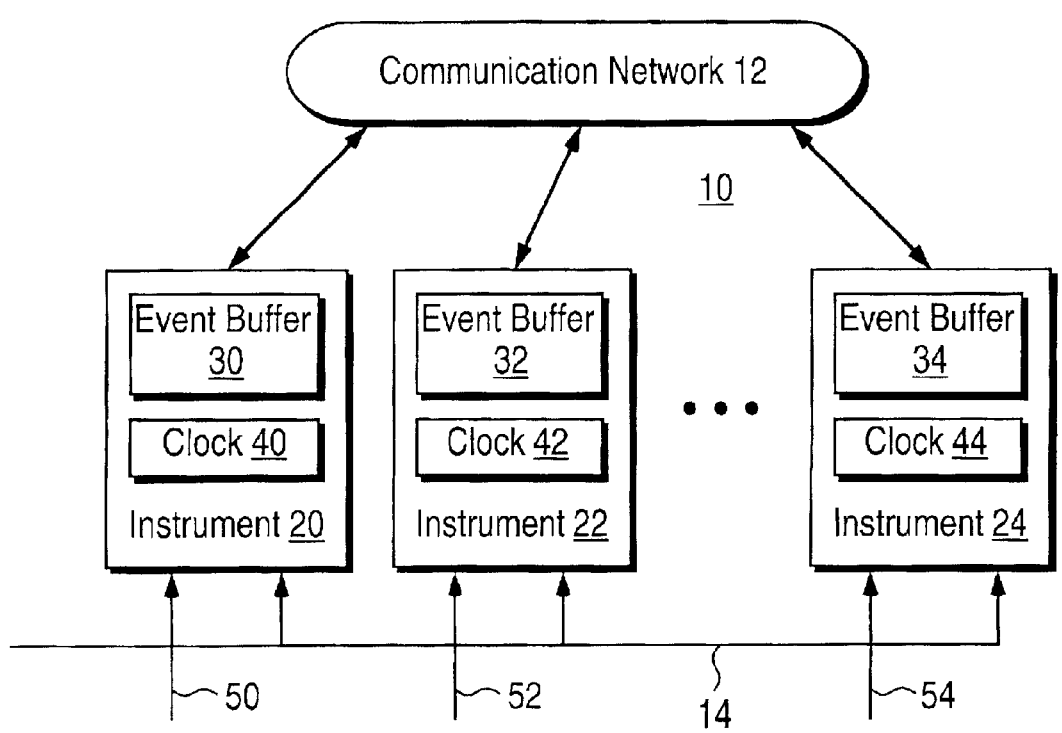
FIG. 1 shows an instrumentation system according to the present teachings.

FIG. 1 shows an instrumentation system 10 according to the present teachings. The instrumentation system 10 obtains measurements via a set of signal paths 50–54. The signal paths 50–54 may be connected to an external system (not shown).

For example, the external system may be a device or system under test.

The instrumentation system 10 includes a set of instruments 20–24. Each instrument 20–24 includes a corresponding event buffer 30–34 and a corresponding clock 40–44. The event buffers 30–34 are used to log the measurements obtained via the corresponding signal paths 50–54. The measurements are logged into the event buffers 30–34 along with time-stamps which are obtained from the clocks 40–44.

For example, the instrument 20 obtains a series of measurements via the signal path 50, generates a time-stamp for each measurement using time values obtained from the clock 40 and stores each measurement together with its corresponding time-stamp into the event buffer 30 as a data record. The measurements may be performed by the instrument 20 according to a sample interval which may be set by user. The sample interval may be based on the clock 40. For example, the sample interval may be every 30 microsecond, 1/10 millisecond, etc., of the time kept by the clock 40. The event buffer 30 is preferably a circular buffer so that while measurements are being obtained the event buffer 30 holds that last x data records where x is the depth of the event buffer 30.

Similarly, the instrument 22 obtains a series of measurements via the signal path 52 and logs the measurements and associated time-stamps obtained from the clock 42 so that the event buffer 32 holds the last x measurements in x data records. The instrument 24 functions in a similar manner. The instruments 20–24 may be programmed with the same or different sample intervals. The event buffers 30–34 may have different depths.

System-wide time correlation among the measurements recorded in the event buffers 30–34 is accomplished by synchronizing the clocks 40–44, thereby providing a synchronized time-base for evaluating the time-stamps and associated measurements which are logged in the event buffers 30–34. Synchronization in this context means that the clocks 40–44 run at substantially similar rates and hold substantially similar time values. The relative accuracy of the time values in the clocks 40–44, with respect to one another, enables relatively accurate correlation among measurements using the associated time-stamps.

The instruments 20–24 implement hardware/software elements for a time synchronization protocol among the respective clocks 40–44. The time synchronization protocol may include transferring timing messages via the communication network 12. The time synchronization protocol may include transferring timing signals via a signal path 14. In one embodiment, the instruments 20–24 perform a synchronization protocol described in U.S. Pat. No. 5,566,180 of Eidson et. al.

In the embodiment shown in FIG. 1, an event trigger signal which is carried on the signal path 14 when asserted causes the event buffers 30–34 to freeze and stop logging new measurement data records. Before assertion of the event trigger signal, the event buffers 30–34 continue to log measurements in the fashion described above. The event trigger signal may be asserted by any one of the instruments 20–24 or by an external device (not shown). For example, the instrument 20 may assert the event trigger signal to stop its own data logging and the data logging in the instruments 22–24. The event trigger signal may be routed among the instruments 20–24 using BNC connections to the signal path 14.

The event trigger signal may be associated with an event in an external system being measured via the signal paths 50–52. For example, the event trigger signal may be is asserted at or near the time the event of interest is to occur or has occurred. After the event trigger signal stops the data logging, the contents of the event buffers 30–34 may be examined and the corresponding time-stamps which are derived from the synchronized clocks 40–44 may be used to correlate the logged measurements in time. The time correlation derived from the synchronized clocks 40–44 provides precise correlation among measurements without expensive engineering and calibrated length cables and specialized electronic implementations which might otherwise be employed to coordinate measurements by instruments.

The following is an example provided for purposes of illustration in which the information shown in Tables 1–2 is recorded in the event buffers 30 and 32, respectively, and frozen by an assertion of the event trigger signal. For this illustration the depth x of each event buffer 30–32, i.e. the number of data records each holds, equals 4. Each event buffer 30 and 32 in effect holds a window of the last 4 measurements in 4 data records.

TABLE 1

| Measurement Value | Time-Stamp |
| --- | --- |
| V1 | 12:25:01.000002 |
| V2 | 12:25:01.000003 |
| V3 | 12:25:01.000004 |
| V4 | 12:25:01.000005 |

TABLE 2

| Measurement Value | Time-Stamp |
| --- | --- |
| V5 | 12:25:01.000004 |
| V6 | 12:25:01.000005 |
| V7 | 12:25:01.000006 |
| V8 | 12:25:01.000007 |

Tables 1–2 show that the windows of data records logged in the event buffers 30 and 32 are skewed in time with respect to one another. The time skew may be caused by different propagation delays in the signal path 14 which carries the event trigger signal and/or different delays in the circuitry implemented in the instruments 20 and 24. The synchronized clocks 40–42 enable a time correlation of values V3 and V5 which have the same time-stamp value and of values V4 and V6 which have the same time-stamp value.

The instrument 20 or another device that generated the event trigger signal, may transfer an event time-stamp associated with the event of interest via the communication network 12. The event time-stamp may be obtained from a clock which is synchronized to the clocks 40–44 or from one of the clocks 40–44. The event time-stamp is received by the instruments 20–24 via the communication network 12 and used to correlate the measurements logged in the event buffers 30–34 to the event of interest. For example, an event time-stamp equal to 12:25:01.000005 yields a correlation of the measurements V4 and V6 with the event of interest.

The present teachings are readily applicable to any measurement and control system having a set of measurement and control instruments. Examples of instruments include volt meters, oscilloscopes, signal generators, and logic analyzers to name a few examples.

The communication network 12 may be a packetized network such as Ethernet or a network such as LonTalk which is adapted to control systems. Alternatively, the communication network 12 may be implemented as a serial or parallel communication bus or other mechanism for communication.

Figure 2:
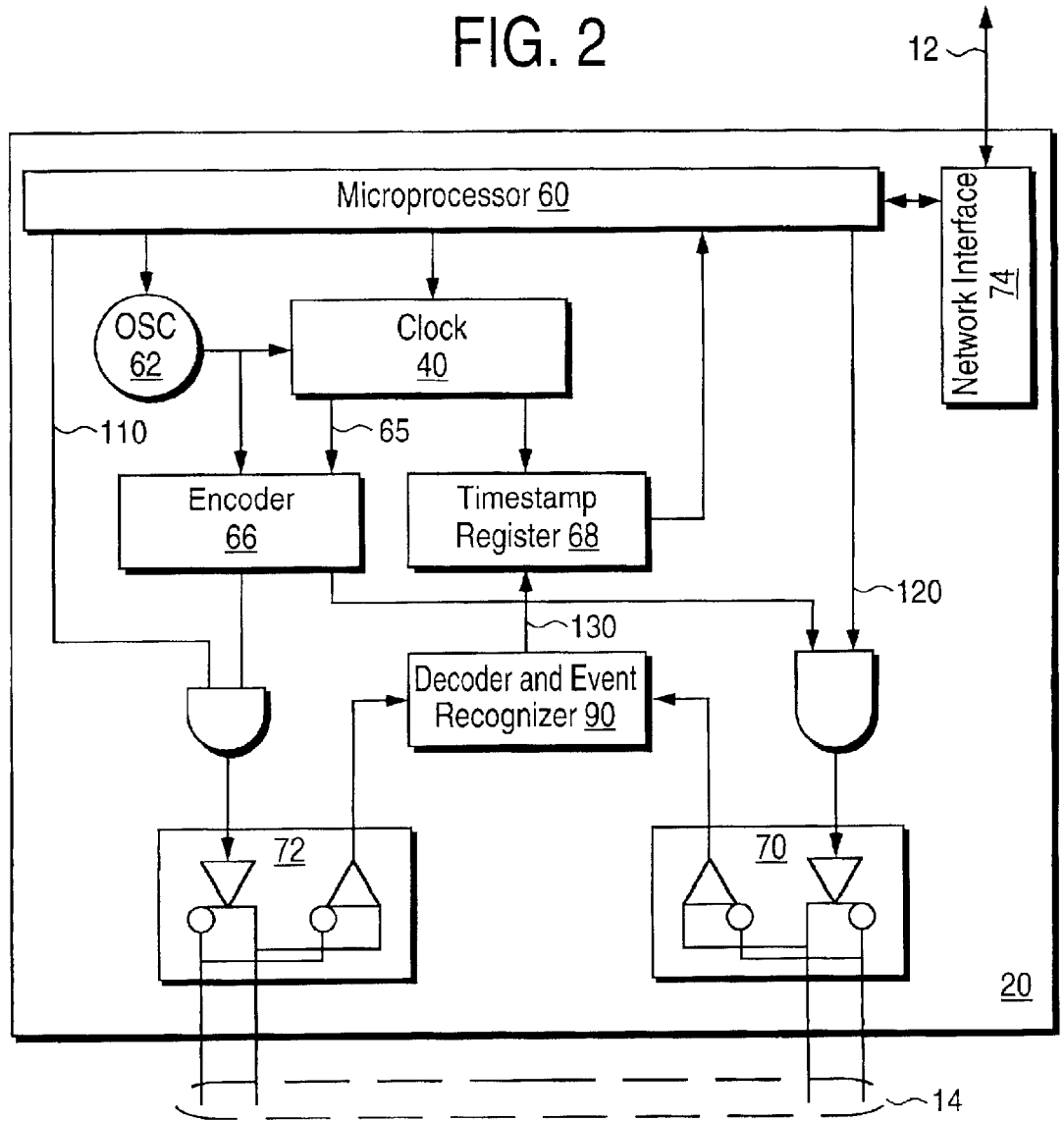
FIG. 2 shows clock synchronization elements in an instrument in one embodiment.

FIG. 2 shows clock synchronization elements in the instrument 20 in one embodiment. The instrument 20 in this example functions as a master of a clock synchronization protocol implemented in the instrumentation system 10. The synchronization protocol in this example includes the transfer of timing signals via the signal path 14 which in this case consists of two physically separate signal paths having the same electrical lengths, e.g. each consists of one of the pairs of a category 5 cable. One of these is accessed by driver 72 or the other by driver 70.

The instrument 20 includes an oscillator 62 which drives the clock 40 and an encoder 66. The encoder 66 performs Manchester encoding on the signal from the oscillator 62 as a fixed pattern. The fixed pattern may be, for example, alternating ones and zeros. A carry out 65 from the fractional seconds portion of the clock 40 is encoded as a distinguished pattern which marks the seconds boundary of the clock 40. The distinguished pattern may be, for example, two consecutive ones.

The output of the encoder 66 drives a timing signal onto the signal path 14. If the clock is a master clock as signaled by 110 the timing signal is placed on signal path 14 via driver 72 to the pair accessed by driver 72.

In one embodiment, the timing signal is driven onto the signal path 14 using an interface circuit 72 which is adapted to an EIA-644 multidrop bus which connects together the instruments 20–24. The instrument 20 when functioning as a slave in the synchronization protocol receives the timing signal via 72. If the clock 40 is a slave as indicated by signal 110 it will not place timing signals onto the signal path 14 via driver 72.

For each seconds boundary which is encoded with the distinguished pattern, a microprocessor 60 obtains a time-stamp for the second boundary from a time-stamp register 68 and transfers the time stamp via the communication network 12 in a follow up packet using a network interface 74.

The time stamps in the time-stamp register 68 are generated as a result of a signal 130 from the decoder and event recognizer 90 which detects the distinguished pattern event from driver 72 and so notifies the time stamp register 68 along with an indication that the event arose from driver 72 or 70.

The instruments 22–24 receive the timing signal via the trigger signal path 14 and the driver 72, decode and recognize the distinguished pattern, generate a time-stamp upon recognition of the distinguished pattern using their local clock, and then use this time-stamp along with the time-stamp received in a follow up packet to determine a correction to be applied to their local clock 42–44 in the instruments 22–24 using a phase lock loop or as a modification to the low order bits of the local clock 42–44.

Corrections for latency on the signal path 14 may be performed by reversing the roles of master/slave of the instruments 22–24 pair-wise and repeating the above steps. There are two alternatives for signaling this reverse process. In the first alternative the slave applies its distinguished timing signal on the same path as the master but in a time that can easily be distinguished from the masters signal. In this alternative driver 70 plays no role. In the second alternative, the slave places its distinguished timing signal on the alternate path 14 accessed via driver 70 and indicated via signal 120.

If the clock is a slave clock and is correcting for latency on the trigger signal path 14 by reversing the roles of master/slave of the instruments 22–24 pair-wise.

Figure 3:
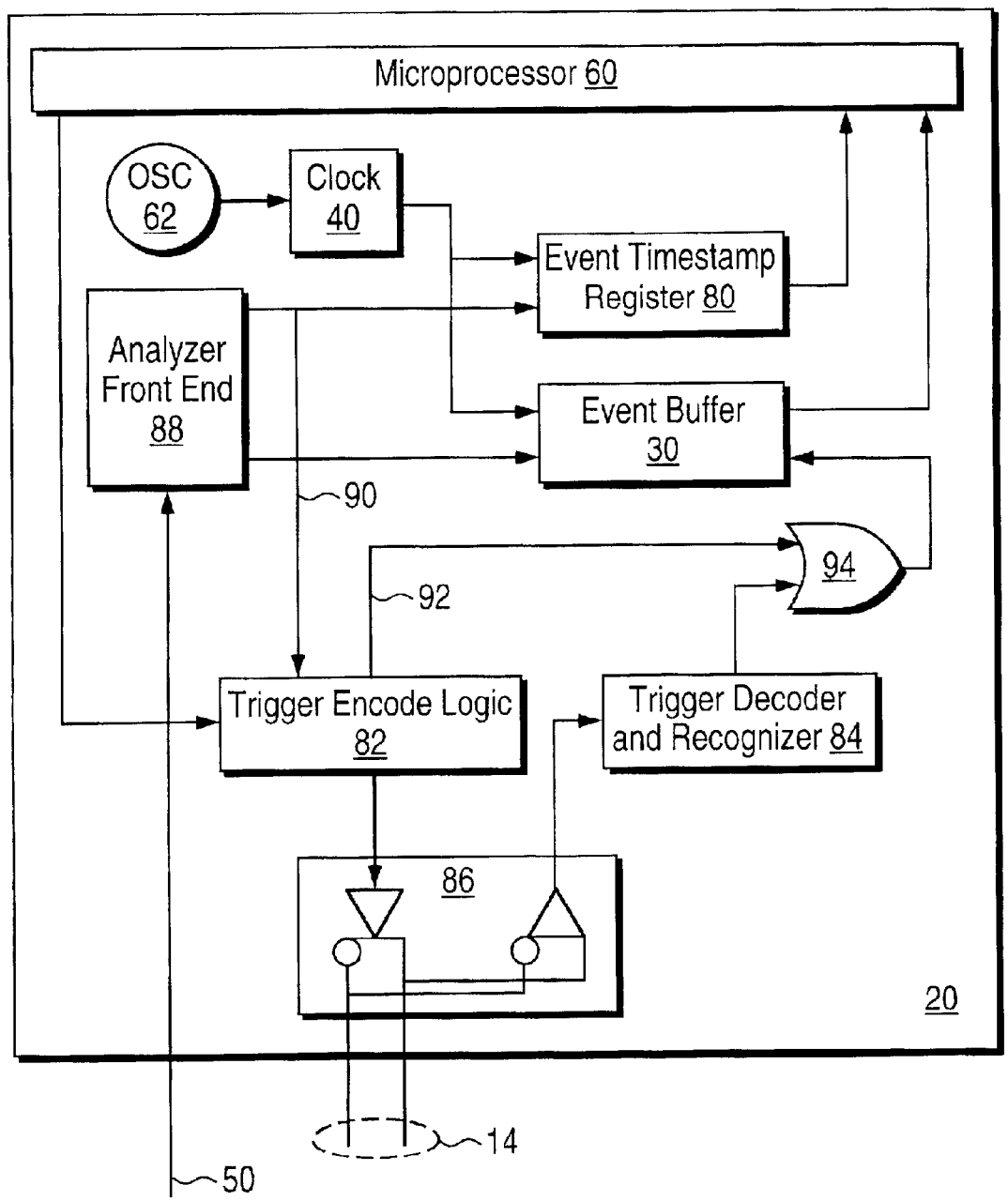
FIG. 3 shows event logging elements in an instrument in one embodiment.

FIG. 3 shows event logging elements in the instrument 20 in one embodiment. Measurement signals received via the signal path 50 are provided to an analyzer front end 88 which performs instrument-specific functions associated with the instrument 20. One example of an instrument-specific function is a logic analyzer function. Another example of an instrument-specific function is an oscilloscope function.

The analyzer front end 88 generates a data record at each sample interval and the data records are time-stamped and logged into the event buffer 30. Time-stamps for the data records are obtained from the clock 40. The analyzer front end 88 also generates an event trigger signal 90 whenever a predefined condition is detected via the signal path 50. The predefined condition, for example, may correspond to an event of interest in a device under test. The event trigger signal 90 is processed by the trigger encode logic 82. If the instrument 20 is designated as a trigger master then the event trigger signal 90 in encoded form is driven onto the trigger signal path 14 via an interface circuit 86 and is also provided as an input 92 to an OR gate 94. The signal is applied to a different portion of the path 14 and than is used by the timing signal for clock synchronization—for example it uses a different pair of a category 5 cable.

The output of the OR gate 94 freezes the event buffer 30 as previously described. The slave instruments 22–24 receive the event trigger signal from the trigger encode logic 82 via the trigger signal path 14 and freeze their event buffers 32–34 as previously described. The event trigger signals need not be precisely calibrated for latency since their function is to freeze the event buffers 30–34, thereby ensuring that relevant data is captured. The time-stamp corresponding to the event trigger signal 90 is available in an event time-stamp register 80.

The microprocessor 60 obtains the event time-stamp from the event time-stamp register 80 and transmits it to the instruments 22–24 via the communication network 12. The instruments 22–24 receive the event time-stamp and use it to process the data in their event buffers 32–34 accordingly. The correlation of the data records in the event buffer 30 may be performed by the microprocessor 60 or some other mechanism such as an external computer system which has access to the communication network 12.

The instrument 20–24 that functions as a master for generating and transmitting the event trigger signal 90 and corresponding trigger time-stamp may or may not be the same instrument 20–24 that functions as a master for the time synchronization protocol among the clocks 40–44. If an event trigger signal originates in any of the instruments 20–24 then a wired OR or a wired AND implementation may be used for the trigger signal path 14.

With the present techniques, the synchronization accuracy among the instruments 20–24 is dependent on the accuracy of synchronization among the clocks 40–44 rather than on the calibration of the trigger signal path 14.

The foregoing detailed description of the present invention is provided for the purposes of illustration and is not intended to be exhaustive or to limit the invention to the precise embodiment disclosed. Accordingly, the scope of the present invention is defined by the appended claims.

What is claimed is:

1. An instrumentation system, comprising:
   means for asserting an event trigger signal on an event signal path;
   a set of instruments each coupled to the event signal path and each having a synchronized clock and an event buffer and means for periodically logging a measurement and a corresponding time-stamp obtained from the synchronized clock into the event buffer, each instrument having a mechanism for freezing the periodic logging in response to the event trigger signal.

2. The instrumentation system of claim 1, further comprising means for transferring an event time-stamp associated with the event trigger signal to the instruments via a communication network such that the event-time stamp enables correlation among the measurements contained in the event buffers.

3. The instrumentation system of claim 2, further comprising a timing signal path coupled to each instrument for exchanging timing signals for the synchronized clocks.

4. The instrumentation system of claim 3, wherein the instruments exchange a time-stamp for each timing signal via the communication network.

5. The instrumentation system of claim 4, wherein each instrument includes means for adjusting the corresponding synchronized clock in response to the timing signals on the timing signal path and the time-stamps carried on the communication network.

6. The instrumentation system of claim 1, wherein the event buffers are circular buffers.

7. The instrumentation system of claim 1, wherein each instrument logs measurements according to a corresponding predetermined sample interval which is derived from the corresponding synchronized clock.

8. An instrument, comprising:
   synchronized clock;
   event buffer;
   means for periodically logging a measurement and a corresponding time-stamp obtained from the synchronized clock into the event buffer;
   means for freezing the periodic logging in response to an event trigger signal.

9. The instrument of claim 8, further comprising means for receiving an event time-stamp associated with the event trigger signal via a communication network such that the event-time stamp enables correlation among the measurements contained in the event buffer.

10. The instrument of claim 8, further comprising means for exchanging a timing signal via a timing signal path for adjusting the synchronized clock.

11. The instrument of claim 10, further comprising means for exchanging a time-stamp for the timing signal via a communication network.

12. The instrument of claim 11, further comprising means for adjusting the synchronized clock in response to the timing signal on the timing signal path and the time-stamp carried on the communication network.

13. The instrument of claim 8, wherein the event buffers are circular buffers.

14. The instrument of claim 8, further comprising means for deriving a sample interval from the synchronized clock such that the measurements are logged in response to the sample interval.

15. A method for obtaining measurements, comprising the steps of:

providing each of a set of instruments with a synchronized clock and an event buffer;

periodically logging a measurement and a corresponding time-stamp obtained from the synchronized clocks into the event buffers;

asserting an event trigger signal on an event signal path;

freezing the periodic loggings in response to the event trigger signal.

16. The method of claim 15, further comprising the step of transferring an event time-stamp associated with the event trigger signal to the instruments via a communication network such that the event-time stamp enables correlation among the measurements contained in the event buffers.

17. The method of claim 16, further comprising the step of exchanging timing signals for the synchronized clocks via a timing signal path to the instruments.

18. The method of claim 17, further comprising the step exchanging a time-stamp for each timing signal via communication network.

19. The method of claim 18, further comprising the step of adjusting the synchronized clock in response to the timing signals on the timing signal path and the time-stamps carried on the communication network.

20. The method of claim 15, further comprising the step of deriving a sample interval from the synchronized clock such that the sample interval is used to periodically log the measurements.

* * * * *